United States Patent
Wilt et al.

[11] Patent Number: 5,231,536
[45] Date of Patent: Jul. 27, 1993

[54] ROBUST, LED ILLUMINATION SYSTEM FOR OCR OF INDICIA ON A SUBSTRATE

[75] Inventors: Donald R. Wilt, Lexington; Richard S. Sidell, Needham, both of Mass.

[73] Assignee: XRL, Inc., Canton, Mass.

[21] Appl. No.: 877,843

[22] Filed: May 1, 1992

[51] Int. Cl.$^5$ ............................................. G02B 27/02
[52] U.S. Cl. .................................. 359/436; 359/385; 356/401; 250/237 R
[58] Field of Search ............... 359/436, 438, 439, 440, 359/385, 390, 391, 392, 393, 368, 372, 373; 356/350, 360, 363, 356, 401, 237; 250/237 R, 237 G, 227.29, 227.30, 548, 560, 578.1

[56] References Cited

U.S. PATENT DOCUMENTS

| | | | |
|---|---|---|---|
| 2,208,882 | 7/1940 | Graff et al. | 359/385 |
| 3,175,458 | 3/1965 | Costa | 359/385 |
| 3,344,700 | 10/1967 | Brake | 359/438 |
| 4,337,442 | 6/1982 | Mauck | 372/13 |
| 4,353,618 | 10/1982 | Hagner et al. | 359/385 |
| 4,412,330 | 10/1983 | Mauck et al. | 372/29 |
| 4,418,467 | 12/1983 | Iwai | 29/574 |
| 4,444,492 | 4/1984 | Lee | 355/55 |
| 4,483,005 | 11/1984 | Smart | 372/25 |
| 4,558,926 | 12/1985 | Johnson | 359/305 |
| 4,636,080 | 1/1987 | Feldman | 356/401 |
| 4,685,775 | 8/1987 | Goodman et al. | 359/225 |
| 4,703,166 | 10/1987 | Bruning | 250/201 |
| 4,732,473 | 3/1988 | Bille et al. | 356/237 |
| 4,745,289 | 5/1988 | Mashima | 250/548 |
| 4,750,835 | 6/1988 | McMurtry | 250/227.29 |
| 4,769,523 | 9/1988 | Tanimoto et al. | 219/121.6 |
| 4,772,774 | 9/1988 | Lejeune et al. | 219/121.69 |
| 4,795,881 | 1/1989 | Lejeune et al. | 219/121.69 |
| 4,833,336 | 5/1989 | Kraske | 250/237 R |
| 4,872,052 | 10/1989 | Liudzius et al. | 358/106 |
| 4,907,091 | 3/1990 | Yoshida et al. | 250/237 R |
| 4,918,284 | 4/1990 | Weisz | 219/121.78 |
| 4,930,901 | 6/1990 | Johnson et al. | 372/26 |
| 4,941,082 | 7/1990 | Pailthorp et al. | 364/167.01 |
| 5,000,542 | 3/1991 | Nishimura et al. | 359/439 |
| 5,048,968 | 9/1991 | Suzuki | 356/401 |
| 5,057,664 | 10/1991 | Johnson et al. | 219/121.69 |

OTHER PUBLICATIONS

Brochure entitled "Self-Illuminating Camera System (SICS)," of Stahl Research Laboratories, Inc., 3 Westchester Plaza, Elmsford, N.Y. 10523, 2 pages (undated but believed to have been published Jan. 1990).

Brochure entitled "IFS-1 Image Formation System," of ProofLine, Inc., P.O. Box 36053, San Jose, Calif. 95158, 4 pages (undated but believed to have been published by 1989-1990).

Brochure entitled "HineSight® 1500 Wafer I.D. Reader," of Hine Design, 1901 Embarcadero Road ∩104, Palo Alto, Calif. 94303, 2 pages (undated).

*Primary Examiner*—Loha Ben
*Attorney, Agent, or Firm*—Weingarten, Schurgin, Gagnebin & Hayes

[57] ABSTRACT

Double banks of LED's, opaque baffles, and a camera having a field of view are disclosed for reading laser-etched character strings and other indicia on semiconductor wafers and other substrates. The LED's of the banks may be integrally or separably lensed, and masks may be provided proximate the banks and in the near-field of the LED's.

13 Claims, 2 Drawing Sheets

ROBUST, LED ILLUMINATION SYSTEM FOR OCR OF INDICIA ON A SUBSTRATE

FIELD OF THE INVENTION

The instant invention is drawn to the field of optics, and more particularly, to a robust, LED illumination system for optical character recognition of indicia on a substrate.

BACKGROUND OF THE INVENTION

Semiconductor wafers and other substrates may be provided with indicia that indicate, among other things, wafer number and manufacturer. The indicia may be, for example, ⅜ to ⅝ inches in length, and are typically constituted as a matrix of laser-etched pits.

The difficulties in providing machine reading of such laser-etched indicia on semiconductor wafers arise from the fact that the characters themselves are the same color as their wafer substrates and show little relief, from the fact that the wafer surface is polished, so that it reflects thereoff the light used to read the characters, and from the fact that the surface of the wafer may undergo several coating processes which cover the characters and reduce their size and relief.

The heretofore known optical character recognition systems have utilized the small surface irregularities introduced by the indicia to reflect light to a camera. But because the dots are so smooth, they disperse light only through a small angle, and in some instances, extremely small angles. As a result, the source of the light must be at a very small angle from the line of sight and it must be relatively intense. This places the source in the camera's field of view and the result is, in many instances, that the camera is blinded. While prior art techniques which use beam splitters to direct light along the line of sight have been utilized, these techniques have not been robust enough to illuminate small characters with many overcoat layers. High intensity fiber optic light sources represent another prior art technique that, while providing very intense light which functions at greater angles and illuminates even the most difficult characters, is subject to the considerable disadvantage that they are expensive, large, and generate unwanted heat and vibration.

SUMMARY OF THE INVENTION

Accordingly, it is the principal object of the present invention to provide a robust, but inexpensive, light emitting diode illumination system for optical character recognition of indicia on a substrate, even when the characters have been overcoated with one or more layers.

In accord therewith, and in one embodiment, a camera having a field of view that is angled at a first acute angle to a normal to the substrate is provided for reading the indicia thereon within its field of view. First and second arrays of light emitting diodes each defining optical paths that are respectively disposed to either side of a second acute angle to the normal to the substrate, where the second acute angle is the same in magnitude as the first acute angle but is to the other side of the normal, are provided for illuminating the indicia on the substrate. First and second baffles respectively disposed along the optical paths of the first and second arrays of light emitting diodes are provided to occlude the respective light emitting diode arrays and thereby prevent them from being imaged within the field of view of the camera while allowing the indicia to be read by the camera in the light of the LED arrays.

In further accord therewith, and in another embodiment, a camera having a field of view that is oriented with its long axis in parallel relation with a normal to the substrate is provided for reading the indicia thereon within its field of view. An optical member optically confronting both the camera and the substrate is provided for deviating light incident thereto to and towards the camera. The optical member may be a plane mirror angled to confront both the camera and the substrate, a double plane mirror, a first mirror member of which is angled to confront the substrate and a second mirror member of which is angled to confront both the camera and the first mirror member, and may be a prism. First and second array of light emitting diodes defining optical paths that are respectively disposed to either side of an acute angle defined with respect to a normal to the substrate are provided for illuminating the indicia on the substrate. First and second baffles respectively disposed along the optical paths of the first and second arrays of LEDs are provided to occlude the respective LED arrays and thereby prevent them from being imaged within the field of view of the camera while allowing the indicia to be read by the camera in the light of the LED arrays.

In either embodiment, the LED arrays may be integrally lensed, or unlensed with separate cylindrical lenses. In either embodiment, slitted masks may be provided in the nearfield of the LED arrays which allow placing comparatively-large and readily-available LEDs closer to the substrate without imaging them within the camera's field of view while reducing overall package size.

BRIEF DESCRIPTION OF THE DRAWINGS

These and other objects, features and advantages of the present invention will become apparent upon reference to the following detailed description of the preferred embodiments and to the drawings wherein.

DETAILED DESCRIPTION OF THE PREFERRED EMBODIMENTS

Figure 1:
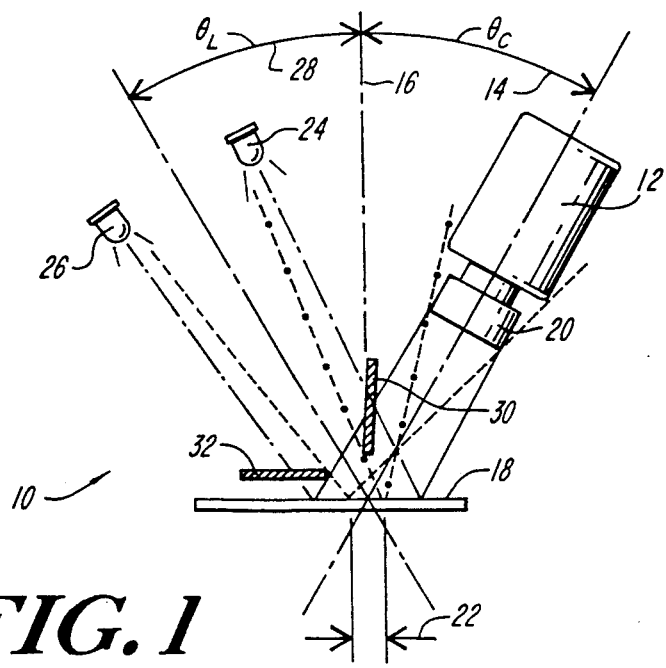
FIG. 1 is a partially-pictorial partially-sectional diagram illustrating one embodiment of the robust LED illumination system for OCR of indicia on a substrate in accord with the present invention.

Referring now to FIG. 1, generally designated at 10 is a schematic diagram illustrating one embodiment of the robust LED illumination system for optical character recognition (OCR) of indicia (such as, laser-etched character strings) on a substrate (such as, semiconductor wafers). A camera 12 is provided at an acute angle marked "$\Theta_c$" and generally designated by arrow 14 that is defined with respect to a normal 16 to a semiconductor wafer 18. The camera 12 has a lens 20 that has a field of view that reads indicia, schematically illustrated by arrows 22, on the wafer 18. It has been found that F numbers for the lens selected from the range of F numbers F/4 to F/16 proves to be most effective. The substrate is mounted on an X, Y translation stage, and the camera/lens subassembly is mounted on a Z translation stage, not shown.

First and second arrays of light emitting diodes, each typically six (6) in number, although other numbers of LEDs may be employed, are respectively disposed to either side of a second acute angle marked "$\Theta_L$" and generally designated by an arrow 28. The angle of the acute angle 28 is the same in magnitude as that of the angle of the acute angle 14, but the second acute angle is to the other side of the normal 16 to the substrate 18. Each of the LEDs of the LED arrays 24, 26 preferably is lensed, although unlensed LEDs together with separate cylindrical lenses may be provided as well. The number of LEDs is selected to provide robust illumination of the indicia 22 on the substrate 18. They are each arrayed in linear alignment to conform to the typically linear arrangement of the indicia 22. Other patterns are possible.

Each of the LED arrays 24, 26 provides optical paths along which their respective light beams illuminate the indicia on the substrate, one to either side thereof. Along the optical path of the array 24 an opaque shutter 30 is disposed, and along the optical path of the LED array 26 an opaque shutter 32 is disposed; the shutters 30, 32 are spaced-apart a preselected distance The shutter 30, which may be any opaque material such as aluminum, is oriented such that its normal is orthogonal to the normal 16 to the wafer 18, and the shutter 32 is oriented such that its normal is parallel to the normal 16 to the substrate 18, although other orientations thereof are possible so long as the direct images of the corresponding arrays are occluded by the corresponding shutter from being imaged off the specular surface of the substrate 18 and thereby picked up by the field of view of the lens 20 of the camera 12 while allowing the indicia 22 to be read therefrom in the light of the illumination provided by the LED arrays 24, 26.

Figure 2:
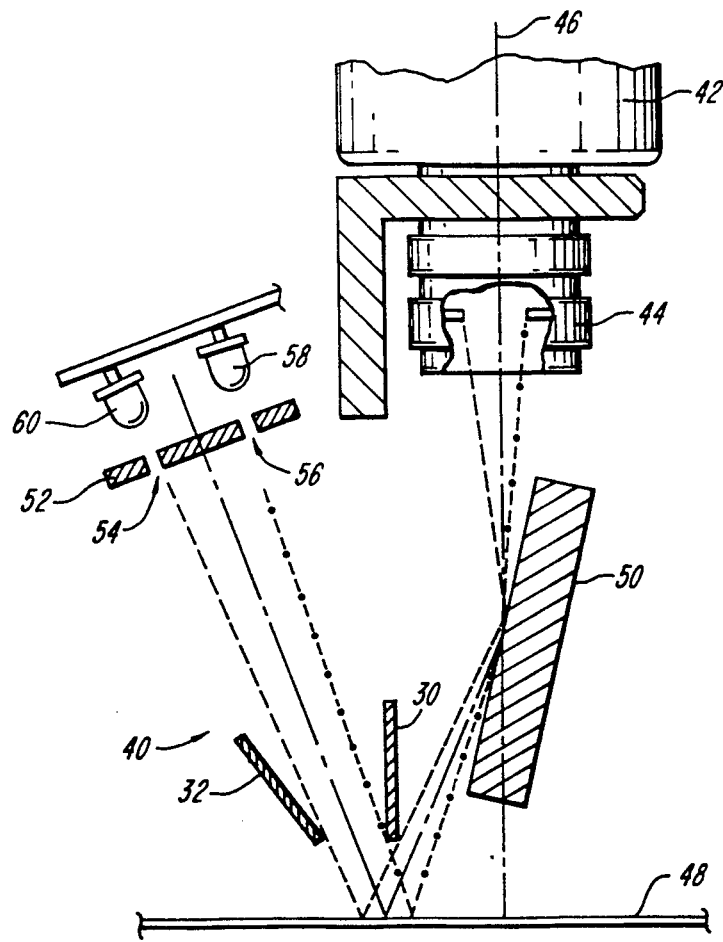
FIG. 2 is a partially-pictorial partially-sectional diagram illustrating another embodiment of the robust LED illumination system for OCR of indicia on a substrate in accord with the present invention.

Referring now to FIG. 2, generally designated at 40 is another embodiment of the robust LED illumination system for optical i character recognition of indicia on a substrate in accord with the present invention. The embodiment 40 of FIG. 2 differs from the embodiment 10 of FIG. 1 in two principal respects. The first respect is that the camera 42 having the lens 44 providing a field of view is mounted with the axis of the camera generally parallel to the normal 46 to the substrate 48, and an optical member 50, such as a planar mirror, is disposed within the field of view of the lens 44 of the camera 42 at a preselected acute angle. The angle at which the mirror is oriented within the field of view of the lens 44 is selected to deviate light reflected off the surface of the wafer 48 into the lens 44 of the camera 42, while allowing the camera 42 to be in the vertical position illustrated. The vertical orientation of the camera, among other advantages, enables a reduction in package size and simplifies mounting.

The second respect in which the embodiment 40 of FIG. 2 differs from that of the embodiment 10 of FIG. 1 is that a mask 52 having generally-rectangular slits generally designated 54, 56 is provided in the nearfield of the LED arrays 58, 60. The mask 52 allows placing large LED's, which are readily commercially available, much closer to the substrate 48, typically a semiconductor wafer, without their being visible within the camera's field of view.

In this embodiment, the individual light emitting diodes of the light emitting diode arrays are preferably lensed, although cylindrical lenses may be added to unlensed LEDs to provide more uniform illumination along the optical paths of the LEDs of the arrays of LEDs.

Figure 3A:
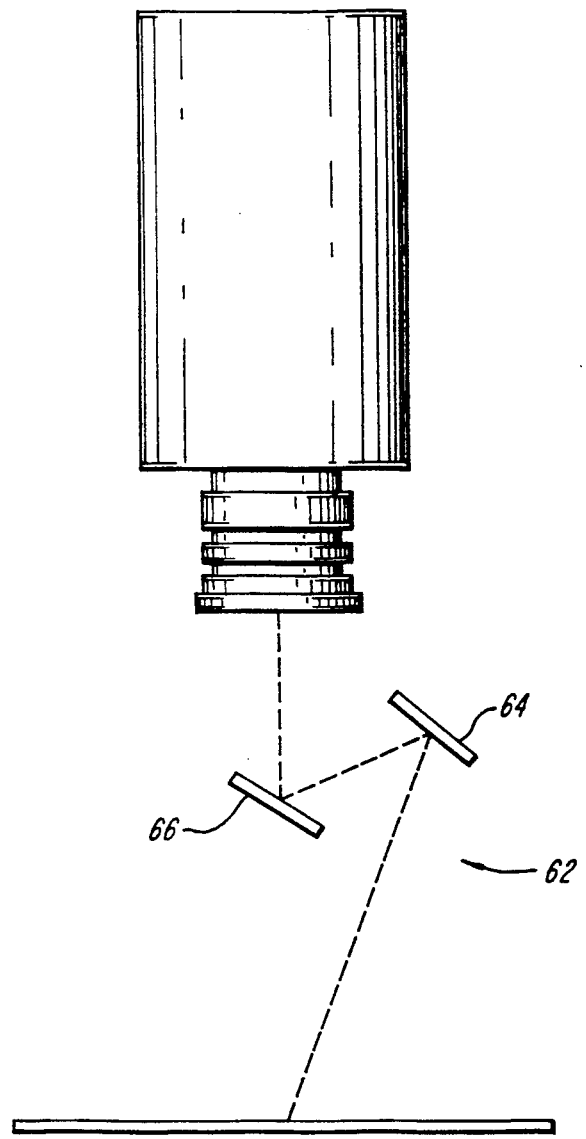
FIGS. 3A and 3B are sectional diagrams illustrating alternative optical members useful in the FIG. 2 embodiment of the robust LED illumination system for OCR of indicia on a substrate in accord with the present invention.

As seen in FIG. 3A, a double plane mirror generally designated 62 may be provided in place of the plane mirror 50 (FIG. 2) to deviate light reflected off the substrate to the camera. A first planar mirror member 64 thereof is angled to confront the substrate and a second planar mirror member 66 thereof is angled to confront both the mirror member 64 and the camera. The double reflections thereoff present a true image of the indicia to be read.

Figure 3B:
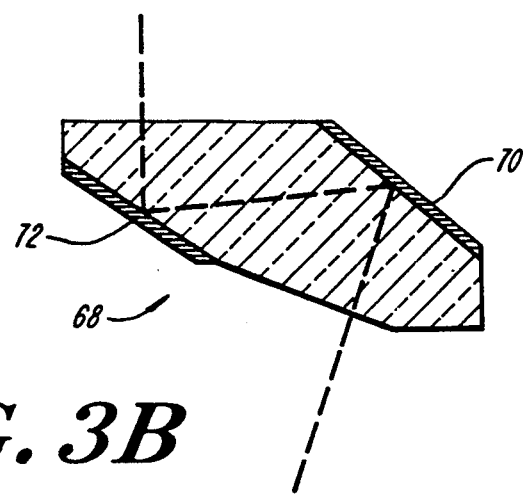

As seen in FIG. 3B, a prism generally designated 68 may be provided in place of the plane mirror 50 to deviate light reflected off the substrate to the camera. The prism 68 has silvered surfaces 70, 72 that function as the members 64, 66 (FIG. 3A) function to image the substrate within the field of view of the camera.

Many modifications of the presently disclosed invention will become apparent to those of skill in the art having benefitted from the instant disclosure without departing from the inventive concept.

What is claimed is:

1. A robust illumination system for illuminating indicia on a substrate, comprising:
    a camera having a field of view that is angled at a first acute angle to a normal to the substrate for reading the indicia thereon within its field of view;
    first and second arrays of light emitting diodes defining optical paths that are respectively disposed to either side of a second acute angle to the normal to the substrate, where the second acute angle is the same in magnitude as the first acute angle but is to the other side of the normal for uniformly illuminating the indicia on the substrate; and
    first and second baffles respectively disposed along the optical paths of the first and second arrays of light emitting diodes that occlude the respective light emitting diode arrays and thereby prevent them from being imaged within the field of view of the camera while allowing the indicia to be read by the camera in the light of the illumination of the light emitting diode arrays.

2. The invention of claim wherein said LED arrays are constituted by lensed LEDs.

3. The invention of claim 1, wherein the LED arrays are each constituted by non-lensed LEDs together with a cooperative cylindrical lens.

4. The invention of claim 1, further including:
    an apertured mask in the nearfield of the first and second LED arrays.

5. A robust illumination system illuminating indicia on the surface of a substrate, comprising:
    a camera having a field of view that is oriented with its longitudinal axis generally parallel to a normal to the substrate;
    an optical member confronting the camera as well as the substrate so as to deviate light incident thereto from the substrate to and towards the camera;
    first and second arrays of light emitting diodes defining optical paths that are respectively disposed to either side of an acute angle defined with respect to a normal to the substrate for illuminating the indicia on t he substrate; and first and second baffles respectively disposed along the optical paths of the first and second arrays of light emitting diodes that occlude the respective light emitting diode arrays and thereby prevent them from being imaged onto the optical member while allowing the indicia to be imaged by the optical member and deviated therefrom to the camera allowing it to read the indicia in the light of the illumination of the light emitting diode arrays.

6. The invention of claim 5, wherein said LED arrays are constituted by lensed light emitting diodes.

7. The invention of claim 5, wherein the light emitting diode arrays are constituted by non-lensed light emitting diodes, together with cooperative cylindrical lenses.

8. The invention of claim 5, further including an apertured mask in the nearfield of the light emitting diode arrays.

9. The invention of claim 5, further including a lens in the near field of the camera.

10. The invention of claim 9, wherein said lens has an F number selected over the range of F numbers from F/4 to F/16.

11. The invention of claim 5, wherein said optical member is a planar mirror angled to confront both the camera and the substrate.

12. The invention of claim 5, wherein said optical member is a double plane mirror, a first mirror member of which is angled to only confront the substrate and a second mirror member of which is angled to confront both the camera and the first mirror member.

13. The invention of claim 5, wherein said optical member is a prism having double specular surfaces, one specular surface of which is angled to only confront the substrate and the other specular surface of which is angled to confront both the camera and said one specular surface.

* * * * *

UNITED STATES PATENT AND TRADEMARK OFFICE
CERTIFICATE OF CORRECTION

PATENT NO. : 5,231,536
DATED : July 27, 1993
INVENTOR(S) : Donald R. Wilt

It is certified that error appears in the above-indentified patent and that said Letters Patent is hereby corrected as shown below:

Column 3, line 43, "optical i" should read --optical--.

Column 4, line 48, "claim wherein" should read --claim 1 wherein--.

Column 4, line 68, "t he" should read --the--.

Signed and Sealed this

Twenty-eighth Day of June, 1994

Attest:

BRUCE LEHMAN

*Attesting Officer*          *Commissioner of Patents and Trademarks*